(12) United States Patent
Steinwandel et al.

(10) Patent No.: US 10,479,512 B2
(45) Date of Patent: Nov. 19, 2019

(54) ELECTRICAL DE-ICING FOR AIRCRAFT

(71) Applicant: AIRBUS DEFENCE AND SPACE GMBH, Taufkirchen (DE)

(72) Inventors: Juergen Steinwandel, Taufkirchen (DE); Dietrich Jonke, Taufkirchen (DE); Helmut Piringer, Taufkirchen (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 346 days.

(21) Appl. No.: 15/272,988

(22) Filed: Sep. 22, 2016

(65) Prior Publication Data
US 2017/0081033 A1    Mar. 23, 2017

(30) Foreign Application Priority Data
Sep. 23, 2015    (EP) .................... 15186476

(51) Int. Cl.
*B64D 15/12*    (2006.01)
*B05D 1/22*    (2006.01)
(Continued)

(52) U.S. Cl.
CPC ............... *B64D 15/12* (2013.01); *B05D 1/22* (2013.01); *B05D 3/0218* (2013.01); *C23C 16/0218* (2013.01); *C23C 16/325* (2013.01); *C23C 16/342* (2013.01); *C23C 16/38* (2013.01); *C23C 16/403* (2013.01); *C23C 16/44* (2013.01); *H05B 3/145* (2013.01); *H05B 3/22* (2013.01); *H05B 2214/02* (2013.01)

(58) Field of Classification Search
CPC ...... B64D 15/12; B64D 2221/00; H05B 3/22; H05B 3/145; H05B 2214/02; C23C 16/38; C23C 16/325; C23C 16/342; C23C 16/0218; C23C 16/44; C23C 16/403; B05D 1/22; B05D 3/0218
See application file for complete search history.

(56) References Cited

U.S. PATENT DOCUMENTS 1,868,468 A * 7/1932 Thompson ............. B64D 15/12
                                                244/134 D
5,316,851 A   5/1994 Brun et al.
(Continued)

FOREIGN PATENT DOCUMENTS

CN    201541355 U    8/2010
CN    102460447 A    5/2012
(Continued)

OTHER PUBLICATIONS

European Search Report for Application No. 15186476 dated Mar. 7, 2016.
(Continued)

*Primary Examiner* — Valentina Xavier
(74) *Attorney, Agent, or Firm* — Jenkins, Wilson, Taylor & Hunt, P.A.

(57) ABSTRACT

A heating element for in-flight de-icing of aircraft is disclosed. The heating element includes a carbon fiber material that is designed to be arranged on a component of an aircraft. The carbon fiber material includes at least two electrical contacts for connecting to an electrical wiring system, and at least one insulation layer for electrical insulation.

17 Claims, 3 Drawing Sheets

(51) Int. Cl.
*C23C 16/44* (2006.01)
*C23C 16/02* (2006.01)
*C23C 16/40* (2006.01)
*C23C 16/34* (2006.01)
*C23C 16/32* (2006.01)
*C23C 16/38* (2006.01)
*B05D 3/02* (2006.01)
*H05B 3/14* (2006.01)
*H05B 3/22* (2006.01)

(56) References Cited

U.S. PATENT DOCUMENTS

| | | |
|---|---|---|
| 5,934,617 A | 8/1999 | Rutherford |
| 5,947,418 A | 9/1999 | Bessiere et al. |
| 6,031,214 A * | 2/2000 | Bost ............... B64D 15/12 219/202 |
| 8,664,573 B2 | 3/2014 | Shah et al. |
| 8,998,144 B2 | 4/2015 | Boone et al. |
| 9,253,823 B2 | 2/2016 | Nordman et al. |
| 9,309,001 B2 | 4/2016 | Calder et al. |
| 2010/0155538 A1 | 6/2010 | Calder et al. |
| 2011/0024409 A1 * | 2/2011 | Shah ............... B64D 15/12 219/482 |
| 2014/0224782 A1 | 8/2014 | Nordman et al. |
| 2016/0221680 A1 * | 8/2016 | Burton ............... B64D 15/12 |
| 2017/0258268 A1 * | 9/2017 | Kazanas ............... A47J 37/06 |
| 2018/0057176 A1 * | 3/2018 | Kinlen ............... B64C 27/46 |

FOREIGN PATENT DOCUMENTS

| | | |
|---|---|---|
| CN | 103538724 A | 1/2014 |
| DE | 2628731 | 12/1977 |
| JP | 2008-230237 A | 10/2008 |
| JP | 2015-513934 A | 6/2012 |
| JP | 2012/162835 A1 | 8/2012 |
| JP | 2014-195990 A | 10/2014 |

OTHER PUBLICATIONS

Japanese Office Action for Japanese Application No. 2016-184154 dated Jun. 16, 2017.
Chinese Office Action for Chinese Application No. 201610933335.8 dated Jul. 3, 2018.
Chinese Office Action for Application No. 201610933335.8 dated Mar. 21, 2019.

* cited by examiner

ELECTRICAL DE-ICING FOR AIRCRAFT

CROSS-REFERENCE TO RELATED APPLICATION

This application claims priority to European Patent Application EP 15 186476.6 filed Sep. 23, 2015, the entire disclosure of which is incorporated by reference herein.

TECHNICAL FIELD

The present disclosure relates to a heating element for in-flight de-icing of aircraft, to a heating device for in-flight de-icing of aircraft, to a method for producing a heating element for in-flight de-icing of aircraft, and to a method for de-icing a component of an aircraft.

BACKGROUND

Ice and snow on aircraft represent a significant safety issue in aviation and cause, for example, an increase in the weight of the aircraft, sometimes a deterioration of the aerodynamics, and in particular asymmetry in terms of the shape and mass. Not only does this increase the fuel consumption, but the maneuverability of the aircraft can also be significantly impaired, and this can result in serious accidents.

De-icing measures are therefore taken in order both to prevent freezing and to eliminate freezing that has already occurred. In this case, a distinction must be made between ground-based de-icing and in-flight de-icing. Ground-based de-icing takes place immediately before an aircraft takes off, and is usually carried out by spraying glycol mixtures onto relevant surfaces of the aircraft that are at risk of icing up. In-flight de-icing, in contrast, is carried out during a flight and generally takes place from an inside region of the aircraft. According to the conventional procedure, in this case hot bleed air is usually conveyed from the engine compressors into suitable cavities or channels in order to heat adjacent regions and thus to prevent ice formation or to thaw ice that has already formed.

This "thermal" method that is based on bleed air is complex in terms of both the method and the apparatus It requires a high number of components (such as shut-off valves, pipes and branches, suction connection pieces and pressure controllers), and a system of this kind involves complex control, high weight and a large space requirement. In addition, fiber composite structures for example, in particular structures that comprise a binder resin in addition to carbon fibers, cannot be treated using bleed air from the engine compressor. This is because the air to be conveyed out of the engine compressor is generally at a temperature of over 200° C., which would damage the resin-based material in a region in contact with the hot air.

In addition to thermal method, electrical de-icing is also known. For this purpose, thin heating wires or a heating film is/are usually introduced into or applied to the material, and the heating wires or the heating film is/are connected to an electrical power system. Electric heat is thus generated, which heat prevents ice formation and/or melts existing ice. However, the efficiency of this procedure is poor, meaning that a large amount of energy is required. As a result, it is usually used only for viewing windows, in particular windscreens on the cockpit.

SUMMARY

One idea of the present disclosure is to make possible in-flight de-icing that is simple in terms of method and apparatus.

A heating element according to some embodiments of the disclosure herein comprises a carbon fiber material that is designed (in particular in terms of its shape) to be arranged on a component of an aircraft (e.g. of an airplane) (for example by being matched to a contour of the component of the aircraft and/or being fitted into a recess in the component). In this case, the carbon fiber material comprises at least two electrical contacts for connecting to an electrical wiring system, and at least one insulation layer for electrical insulation.

An electrically operated heating element of this kind can be activated and controlled in a manner that is uncomplicated in terms of control and that has short response times. The element in particular makes it possible to omit a complex air conveying system. In addition, the element requires little space and has a relatively low weight. As a result, the fuel consumption of the aircraft can be reduced compared with conventional de-icing apparatuses based on bleed air. Finally, using carbon fiber material permits good formability, meaning that the heating element can be appropriately shaped in a simple manner and can be incorporated into an existing structural member.

The component of the aircraft can comprise, for example, an inner lining of a wing, a leading edge, an engine casing or an engine inlet. The component can in particular have a metal and/or a composite structure consisting of metal portions and portions made of carbon fiber-reinforced carbon (e.g. a wing structure that is manufactured from carbon fiber-reinforced carbon and has a metal leading edge).

The electrical wiring system may in particular comprise a (preferably controllable) voltage source.

When arranged (as intended) on the component, the heating element can touch the component, but can also be positioned so as to be spaced apart from the component. In the second case, the spacing between the heating element and the component is preferably sufficiently small that the heating element can heat at least a portion of the component, for example at a spacing of less than 3 cm, more preferably at a spacing of less than 1.5 cm.

The at least one insulation layer for electrical insulation (also referred to in the following as "electrical insulation layer") can electrically insulate the arranged heating element from the component. The layer can contain, for example, a ceramic material (such as aluminum oxide ($Al_2O_3$)), boron nitride (BN), silicon carbide (SiC), zirconium diboride ($ZrB_2$) and/or hafnium diboride ($HfB_2$)). According to an advantageous variant, the at least one insulation layer is gastight. Particularly good heat transfer can thereby be achieved.

A (production) method according to the disclosure herein is used for producing a heating element for in-flight de-icing of aircraft. The method comprises attaching electrical contacts to a carbon fiber material, and applying an electrical insulation layer to the carbon fiber material.

In particular, a heating element according to the disclosure herein can thus be produced according to one of the embodiments set out in this specification, and the corresponding advantages can thus be achieved.

According to some embodiments of the present disclosure, the electrical insulation layer comprises a ceramic basic material (such as aluminum oxide) that has been or is applied as a coating slip. Delamination of the carbon fiber material or of the insulation layer from the carbon fiber material can thus be prevented or at least impeded.

According to some embodiments, a heating element according to the disclosure herein comprises at least one electrically insulating spacer that is designed to rest on at least one structural member of the aircraft after the heating element has been arranged on the component, and to ensure a (positive) spacing between the coated carbon fiber material and the at least one structural member. In this case, the at least one structural member can be the component itself on which the heating element has been arranged, or it can be a further element of the aircraft, for example a support and/or stabilization element in the component.

If the spacer creates the spacing in a surface region of the coated carbon fiber material that is not provided with an electrical insulation layer, the spacer provides electrical insulation between the coated carbon fiber material and the at least one structural member. Otherwise, the spacer can improve the insulation when the insulation layer is relatively thin.

The at least one spacer can be applied in the form of one or more individual nubs and/or can cover a surface region of the coated carbon fiber material in the form of a film, for example along a strip. A spacer of this kind is particularly stable in terms of its position, and is also simple to apply.

An embodiment is advantageous in which the spacing is also produced in a surrounding region of the spacer, such that the spacer thus maintains at least one (preferably free, i.e. air-permeable) intermediate space between the at least one structural member (e.g. between a surface of the component on which the heating element is or has been placed) and the coated carbon fiber material. An intermediate space of this kind permits air circulation and thus uniform heating.

The spacing produced by the at least one spacer may be in a range of from 0.1 cm to 3 cm, for example in a range of from 0.1 cm to 1.5 cm. These dimensions ensure close matching to the contour of the heating element, and thus good heat transfer as well as a low space requirement of the heating element, and at the same time the spacing is also sufficiently large to ensure, if necessary, electrical insulation between the coated carbon fiber material and the at least one structural member, and/or advantageous air circulation.

An embodiment is advantageous in which the at least one spacer has relatively low thermal conductivity, for example a conductivity that is less than 35 W/(m•K), or even less than 30 W/(m•K). In particular, the at least one spacer can comprise a ceramic material, such as aluminum oxide, and/or an insulating, heat-resistant plastics material, such as at least one polyamide and/or at least one polyimide (e.g. kapton).

Materials of this kind are heat-resistant and are therefore not damaged by contact with the heating element when the element is hot, and at the same time the low thermal conductivity ensures uniformity in the heating of the component, both at the location of the spacer and at a location at which an intermediate space is optionally created by the spacer between the coated carbon fiber material and the at least one structural member (e.g. the component).

The carbon fiber material can be a woven fabric or a non-woven fabric. The fibers of the carbon fiber material can in particular be graphite fibers or comprise graphite fibers. According to some embodiments, the carbon fiber material is multilayered and/or carbonized. As a result, particularly high mechanical strength and dimensional stability are achieved in each case. In particular, the carbon fiber material may for example be a carbon fiber-reinforced carbon (also referred to in technical terminology as "CFC").

According to some embodiments, the carbon fiber material is graphitized and/or heat-treated (calcined). A material of this kind has high strength and low porosity. According to some embodiments, a (production) method according to the disclosure herein similarly comprises carbonizing, graphitizing and/or calcining the carbon fiber material.

Some embodiments of a heating element according to the disclosure herein may be advantageous in which a silicon carbide layer is arranged between the carbon fiber material and the at least one electrical insulation layer. A silicon carbide layer of this kind has advantageously high thermal conductivity, i.e. is an effective heat conductor. The layer forms a particularly good base for the electrical insulation layer.

Similarly, an embodiment of a (production) method according to the disclosure herein is advantageous in which the carbon fiber material is siliconized, for example by applying liquid silicon. This causes a reaction with carbon in the carbon fiber material, from which a layer of silicon carbide (SiC) results. A variant is particularly preferred in which processing by mechanical treatment and/or treatment using plasma technology and/or processing using a laser and/or a water jet technique is carried out before the carbon fiber material is siliconized. A surface to which the liquid silicon is applied can be roughened in this manner, and the reaction and the layer formation or layer adhesion can thus be improved.

According to some embodiments, the carbon fiber material comprises a carbon fiber/scrim element. This element can be formed as a two-dimensional or three-dimensional structure for example, which structure is preferably matched to a contour of the component of the aircraft on which the carbon fiber material is designed to be arranged. Heating elements having carbon fiber/scrim elements of this kind are particularly advantageous in production on account of the mesh structure.

In a variant the carbon fiber/scrim element may comprise a back-injection layer that comprises at least one plastics material, for example a polyamide (in particular a polyphthalamide) and/or polyarylamide. In this case, the back-injection layer may enclose and electrically insulate the electrical contacts. In some embodiments the back-injection layer may be arranged (at least) on a side remote from the component.

The electrical insulation layer on the carbon fiber/scrim element is preferably a coating that meshes in at least some of the grid intermediate spaces (i.e. holes in the grid structure). The insulation layer can preferably be produced by a fluidized bed coating process and/or by chemical vapor deposition (also referred to in technical terminology as "CVD"). The meshing in the holes ensures a coating that is reliably insulating and is loadable and has lasting adhesion. Similarly, according to an advantageous embodiment of a (production) method according to the disclosure herein, the electrical insulation layer is applied by fluidized bed coating and/or chemical vapor deposition.

A heating device according to the disclosure herein is used for in-flight de-icing of aircraft. The device comprises a plurality of heating elements according to any of the preceding claims, which elements can be (inter)connected in series or connected in parallel (with one another). A heating device of this kind makes it possible to achieve in-flight de-icing having the above-mentioned advantages of the heating elements at various positions on an aircraft.

A (de-icing) method according to the disclosure herein is used for de-icing a component of an aircraft. The method comprises producing an electrical connection between electrical contacts of a heating element and an electrical wiring system, the heating element comprising a carbon fiber material coated with at least one insulation layer and being arranged on the component of the aircraft.

A de-icing method of this kind is simple to control. In contrast with thermal de-icing, the method can also be carried out on the ground without the risk of take-off power being withdrawn from the engine or of the surrounding material being damaged on account of a lack of cooling in-flight wind.

In this case, the heating element can be arranged on the component so as to touch the component, but it can also be positioned so as to be spaced apart from the component. In this case, however, the heating element and the component are arranged having a mutual spacing that is sufficiently small that the heating element can heat at least a portion of the component, for example at a spacing of less than 3 cm, more preferably at a spacing of less than 1.5 cm.

In particular, the heating element that, according to a (de-icing) method according to the disclosure herein, is electrically connected to an electrical wiring system, can be designed according to an embodiment of a heating element according to the disclosure herein that is set out in this specification, and/or the heating element can have been produced by an embodiment of a production method according to the disclosure herein that is set out in this specification.

In particular, according to some embodiments of a de-icing method according to the disclosure herein, the heating element may be placed on the component so as to have a (positive) spacing therefrom, the spacing in some cases being produced by at least one electrically insulating spacer.

BRIEF DESCRIPTION OF THE DRAWINGS

In the following, features of some embodiments of the disclosure herein will be described in more detail with reference to drawings. It is understood that the individual schematic elements and components can also be combined and/or configured in ways other than those which have been shown and that the present disclosure is not restricted the features which are shown.

In the schematic drawings.

DETAILED DESCRIPTION

Figure 1:
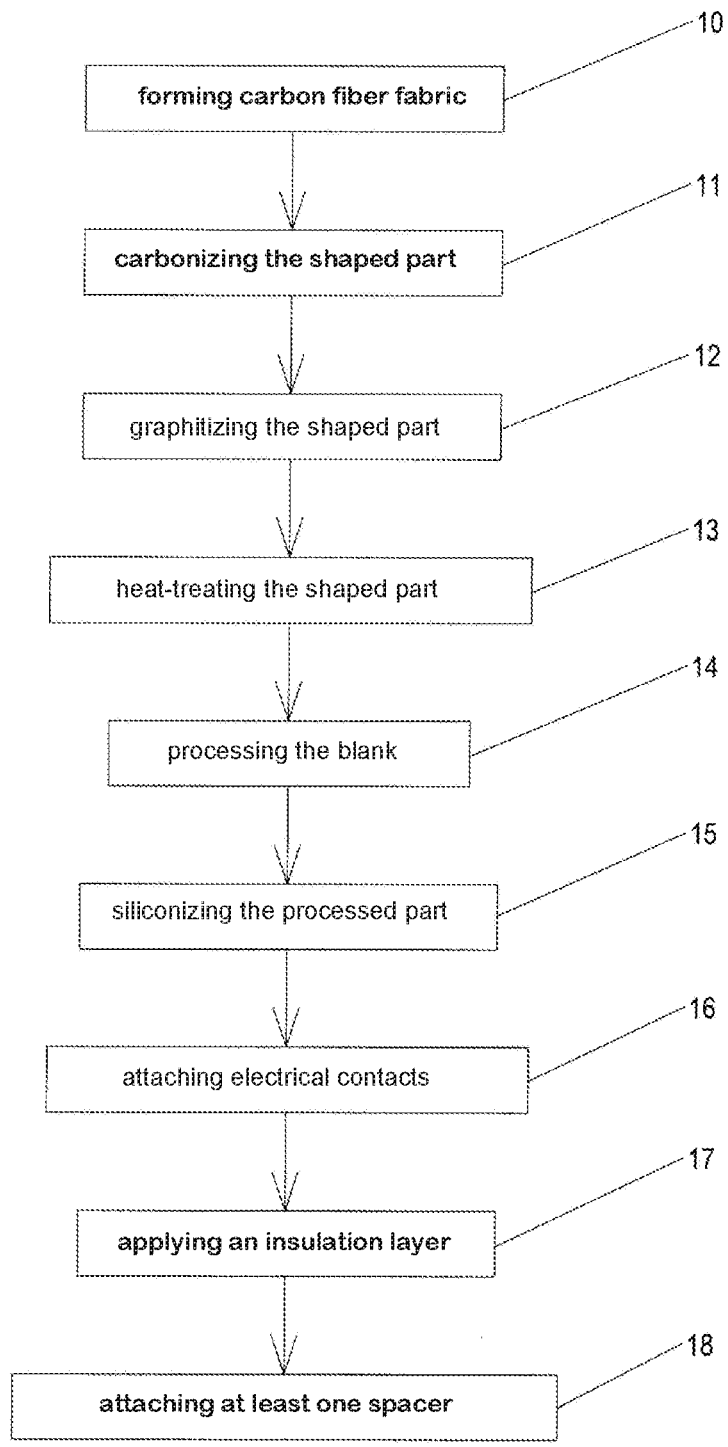
FIG. 1 is a block diagram of a first (production) method, given by way of example, according to some embodiments of the present disclosure.

FIG. 1 is a block diagram of a first (production) method, given by way of example, according to the present disclosure. Of course, other embodiments of a production method according to the disclosure herein need not comprise all the steps shown, and/or the sequence of the steps can be different from that shown.

Initially, in a step 10, a (preferably multilayer) carbon fiber woven fabric is shaped, for example matched to a contour of a component of an aircraft. The resulting shaped part is then carbonized in a step 11 and graphitized in a step 12. This preferably produces a carbon fiber-reinforced carbon blank having high mechanical strength.

The shaped part is heat-treated (calcined) in a step 13. Auxiliary agents contained in the material can thus be eliminated and the shaped part as a whole can be compacted.

The blank produced in the preceding steps is processed in a step 14. The processing can take place mechanically and/or by plasma technology, and/or can comprise treatment using a laser and/or a water jet technique. The processing is in particular used to prepare the surface of the blank for step 15, in which step the processed blank is siliconized. In the process, liquid silicon is preferably applied to at least a portion of the surface of the blank to be processed. The silicon reacts with the carbon of the carbon fiber material to form silicon carbide (SiC) which forms a layer on the carbon fiber material. This layer preferably also covers cut surfaces of the carbon fiber material which may be present.

In step 16, electrical contacts are attached to the carbon fiber material. The contacts are used for connection to an electrical wiring system. This makes it possible to conduct current through the carbon fiber material and thus to heat the heating element.

The silicon carbide layer forms a base for an electrical insulation layer consisting of one or more ceramic basic material(s), which insulation layer is applied in step 17. The electrical insulation layer can in particular comprise aluminum oxide ($Al_2O_3$) for example. The layer is preferably applied by applying a coating slip. As a result, delamination can be prevented which, in contrast, can occur during spraying on account of a high surface tension of the material that is sprayed on.

At least one spacer is attached in step 18, which spacer is intended to rest on at least one structural member of the aircraft after the heating element has been arranged on the component, and to ensure a (positive) spacing between the coated carbon fiber material and the at least one structural member. The at least one spacer is preferably made of an electrically insulating material and can be applied for example as a film along a strip, and/or in the form of one or more individual nubs. Suitable materials for the at least one spacer are, for example, aluminum oxide ($Al_2O_3$), a polyamide and/or a polyimide (e.g. kapton).

Figure 2:
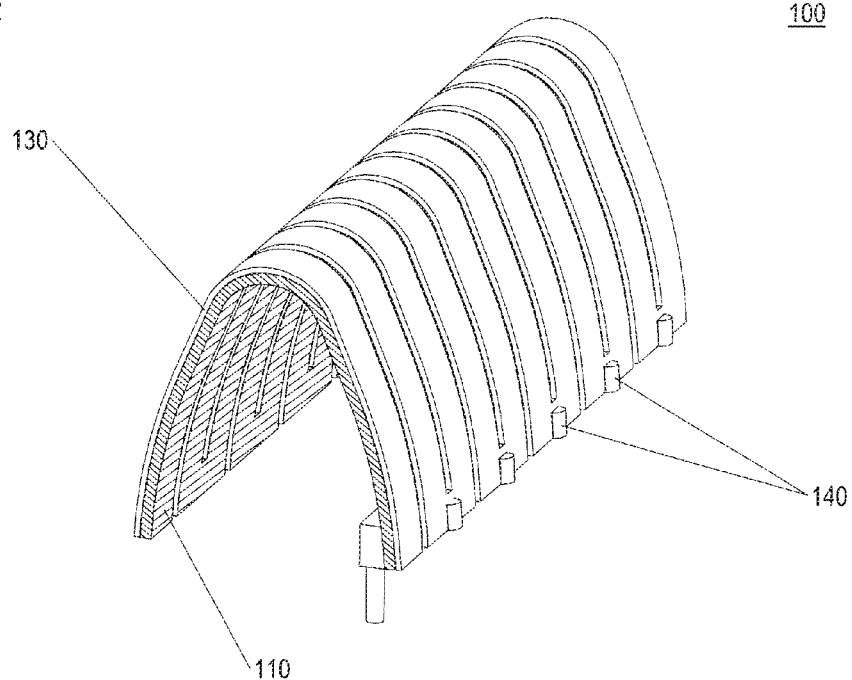
FIG. 2 is a perspective view of a first heating element, given by way of example, according to some embodiments of the present disclosure.

FIG. 2 shows a heating element 100 according to an embodiment of the present disclosure as it could have been produced using a method according to the disclosure herein shown in FIG. 1 for example.

The heating element 100 comprises carbon fiber material 110 that is shaped according to its purpose. In the present case, the carbon fiber material 110 is matched to the contour of a leading edge of a wing, to which the heating element is to be attached, in order to use the component for in-flight de-icing.

In the embodiment shown, the carbon fiber material is formed in the manner of a strip along a web wound into a plurality of ribs. The carbon fiber material 110 preferably comprises a multilayered, carbonized and graphitized carbon fiber fabric, in particular a carbon fiber-reinforced carbon. A material of this kind has particularly high mechanical strength and dimensional stability.

The heating element 100 shown in addition comprises electrical contacts 120 for connecting to an electrical wiring system, and at least one insulation layer 130 for electrical insulation. Of the electrical contacts, only the contact 120 can be seen in the figure, at the front end of the wound web in the drawing. A further electrical contact that is located at the other end of the wound web is hidden.

The at least one electrical insulation layer electrically insulates the heating element 100 from a component of the aircraft on which the carbon fiber material is arranged during use as intended. The electrical insulation layer can contain, for example, aluminum oxide, boron nitride, silicon carbide, zirconium diboride and/or hafnium diboride.

Furthermore, the heating element 100 comprises a plurality of spacers 140 which are preferably made of an electrically insulating material and which, in the case shown, are designed to rest on the component once the heating element has been arranged thereon, and to ensure a (positive) spacing between the coated carbon fiber material and the component.

Figure 3:
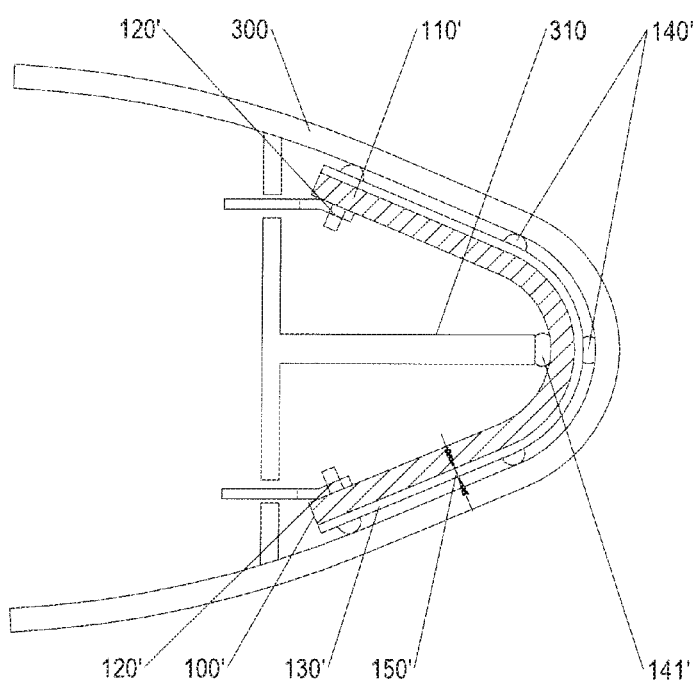
FIG. 3 is a cross-sectional view of heating element according to some embodiments of the present disclosure, given by way of example, arranged on a component.

FIG. 3 is a cross section of a heating element 100' comprising a carbon fiber material 110' that is arranged on a component 300 of an aircraft. In this case, in the example shown, the component 300 is a leading edge of a wing of an aircraft.

The carbon fiber material 110' preferably comprises a multilayered carbon fiber-reinforced carbon. The heating element 100' comprises two electrical contacts 120', by which the carbon fiber material 110' can be connected to an electrical wiring system. The heating element can be heated by electric current being conducted through. The heating element comprises an electrical insulation layer 130' on a surface of the carbon fiber material 110' that faces the component 300, which insulation layer electrically insulates the carbon fiber material from the component.

In addition, the heating element 100' comprises electrically insulating spacers 140' that rest on the component 300 and ensure a spacing 150' between the coated carbon fiber material and the component 300. As a result, the electrical insulation can be improved even when the electrical insulation layer 130' is thin, and an intermediate space can in addition be provided for air circulation. The spacing 150 is preferably in a range of from 0.1 to 3 cm, more preferably in a range of from 0.3 to 1.5 cm.

Furthermore, the heating element 100' comprises a spacer 141' that rests on a structural member 310 of the aircraft and keeps the coated carbon fiber material at a spacing (specified by a thickness of the spacer 141') from the structural member 310. The spacer in particular fixes the heating element by supporting it on the structural member 310', and in addition electrically and preferably also thermally insulates the carbon fiber material from the structural member 310.

Figure 4:
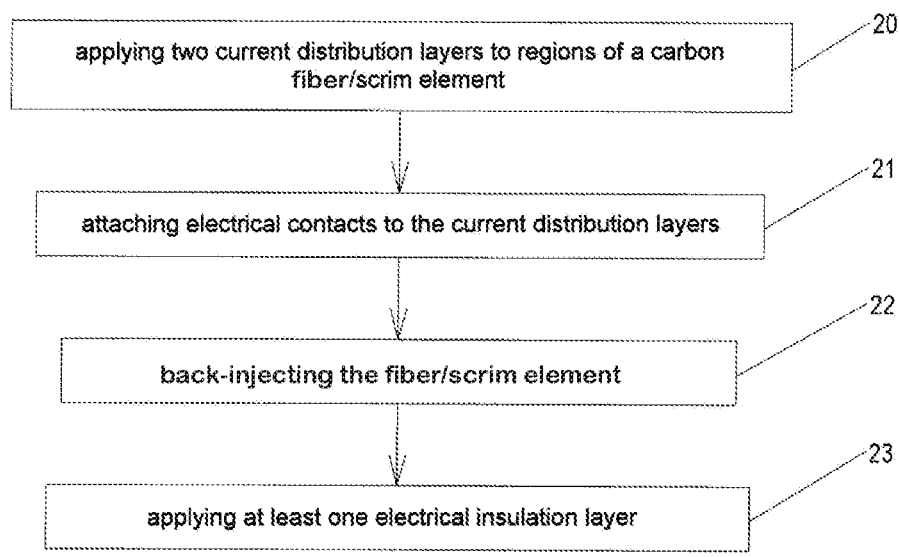
FIG. 4 is a block diagram of a second (production) method, given by way of example, according to some embodiments of the present disclosure.

FIG. 4 is a block diagram of a second (production) method, given by way of example, according to an embodiment of the present disclosure. Of course, other embodiments of a production method according to the disclosure herein need not comprise all the steps shown, and/or the sequence of the steps can be different from that shown.

In a step 20, two current distribution layers are applied to one local region, respectively, of a carbon fiber material in the form of a carbon fiber/scrim element. In this case, the carbon fiber/scrim element preferably has a two-dimensional or three-dimensional structure which can be matched at least locally to a contour of a component, for example, on which the heating element is intended to be arranged.

The current distribution layers applied can, for example, each comprise a metal, e.g. copper. In particular, respective current distribution layers of this kind can be applied, for example, on each of two opposing sides of the carbon fiber/scrim element.

Electrical contacts are attached to the current distribution layers in a step 21.

In step 22, the carbon fiber/scrim element is back-injected with an electrically insulating material, at least in a region of the carbon fiber/scrim element. As a result, the electrical contacts are enclosed in the carbon fiber/scrim element and electrically insulated. The electrically insulating material is preferably a plastics material, such as a polyamide (e.g. a polyphthalamide) or polyarylamide.

In step 23, an electrical insulation layer is applied to the carbon fiber/scrim element. The layer can be applied by a fluidized bed coating process and/or by chemical vapor deposition. The insulation layer applied in this manner is preferably gastight. Particularly good heat transfer can thereby be achieved. Suitable materials for the electrical insulation layer are, for example, boron nitride (BN), silicon carbide (SiC), zirconium diboride ($ZrB_2$) and/or hafnium diboride ($HfB_2$).

Figure 5:
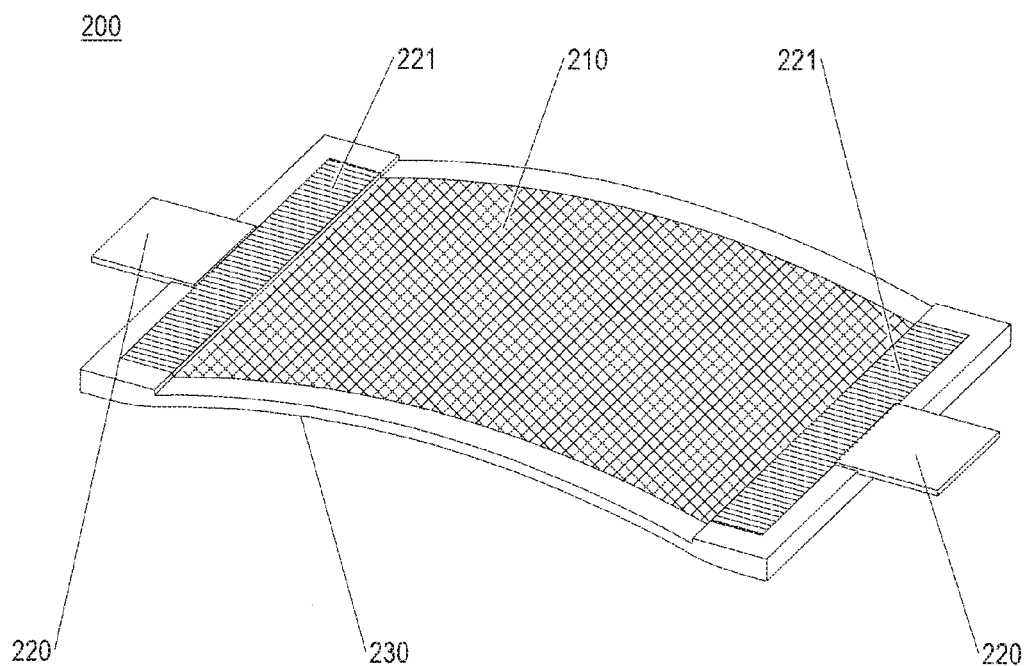
FIG. 5 is a perspective view of a second heating element, given by way of example, according to some embodiments of the present disclosure.

FIG. 5 shows a heating element 200 according to an embodiment of the present disclosure as it could have been produced using a method shown in FIG. 4 for example. The heating element comprises a carbon fiber material 210 in the form of a carbon fiber/scrim element. Respective current distribution layers 221 are applied on two opposing sides of the carbon fiber/scrim element, which layers contain copper for example. The current distribution layers 221 are connected to electrical contacts 220 of the heating element 200. The contacts are designed to be connected to an electrical wiring system. Current flowing through the carbon fiber/scrim element can then heat the heating element so that it can de-ice a component of an aircraft on which it is arranged. The contacts 220 are preferably enclosed by a back-injected plastics material and electrically insulated.

The heating element 200 additionally comprises at least one electrical insulation layer 230 that electrically insulates the heating layer, in particular from the component of the aircraft (on a surface facing the component). The at least one electrical insulation layer is preferably a coating that meshes in the grid structure of the carbon fiber/scrim element, in particular in grid intermediate spaces formed therein. The insulation layer can be applied by a fluidized bed coating process and/or by chemical vapor deposition.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

What is claimed is:

1. A heating element for in-flight de-icing of an aircraft, the heating element comprising:
  a carbon fiber material for arrangement on a component of an aircraft, the carbon fiber material comprising:
    at least two electrical contacts for connecting to an electrical wiring system; and
    at least one insulation layer for electrical insulation; and
  at least one electrically insulating spacer to rest on the component and/or at least one other structural member of the aircraft after the heating element has been arranged on the component to ensure a spacing between the coated carbon fiber material and the component and/or the at least one structural member.

2. The heating element of claim 1, wherein the at least one insulation layer comprises aluminum oxide, boron nitride, silicon carbide, zirconium diboride, and/or hafnium diboride.

3. The heating element of claim 1, wherein the ensured spacing is in a range of from 0.1 to 3 centimeters (cm).

4. The heating element of claim 1, wherein the at least one spacer comprises a ceramic material and/or at least one heat-resistant plastic material.

5. The heating element of claim 1, wherein the carbon fiber material is multilayered, carbonized, graphitized, and/or calcined.

6. The heating element of claim 1, wherein a silicon carbide layer is arranged between the carbon fiber material and the at least one insulation layer for electrical insulation by a reaction between the carbon fiber material and a liquid silicon applied to the carbon fiber material.

7. The heating element of claim 1, wherein the carbon fiber material comprises a carbon fiber/scrim element.

8. The heating element of claim 7, wherein the carbon fiber/scrim element comprises a back-injection layer that comprises a plastics material that electrically insulates the electrical contacts.

9. The heating element of claim 8, wherein the plastics material comprises polyarylamide and/or a polyamide.

10. A heating device for in-flight de-icing of an aircraft, the heating device comprising:
  a plurality of heating elements which are connected in series or in parallel, each of the heating elements comprising:
    a carbon fiber material for arrangement on a component of an aircraft, the carbon fiber material comprising:
      at least two electrical contacts for connecting to an electrical wiring system; and
      at least one insulation layer for electrical insulation; and
    at least one electrically insulating spacer to rest on the component and/or at least one other structural member of the aircraft after the heating element has been arranged on the component to ensure a spacing between the coated carbon fiber material and the component and/or the at least one structural member.

11. A method for producing a heating element for in-flight de-icing of an aircraft, the method comprising:
  attaching electrical contacts to a carbon fiber material for arrangement on a component of an aircraft;
  applying an insulation layer to the carbon fiber material; and
  arranging at least one electrically insulating spacer to rest on the component and/or at least one other structural member of the aircraft after the heating element has been arranged on the component to ensure a spacing between the coated carbon fiber material and the component and/or the at least one structural member.

12. The method of claim 11, comprising carbonizing, graphitizing, calcining, and/or siliconizing the carbon fiber material.

13. The method of claim 11, wherein the insulation layer comprises a ceramic basic material and is applied as a coating slip.

14. The method of claim 11, wherein the insulation layer is applied by fluidized bed coating and/or chemical vapor deposition.

15. A method for in-flight de-icing a component of an aircraft, the method comprising:
  producing an electrical connection between electrical contacts of a heating element and an electrical wiring system, wherein the heating element comprises a carbon fiber material that is coated with at least one insulation layer, thereby forming a coated carbon fiber material, and is arranged on the component of the aircraft; and
  arranging at least one electrically insulating spacer to rest on the component and/or at least one other structural member of the aircraft after the heating element has been arranged on the component to ensure a spacing between the coated carbon fiber material and the component and/or the at least one structural member.

16. The heating element according to claim 8, wherein the back-injection layer is arranged on a side of the carbon fiber/scrim element that is remote from the component of the aircraft.

17. The heating element according to claim 8, wherein the carbon fiber/scrim element comprises grid intermediate spaces, and wherein the back-injection layer is a coating that meshes in at least some of the grid intermediate spaces in the carbon fiber/scrim element.

* * * * *